(12) United States Patent
Eychaner et al.

(10) Patent No.: US 8,713,869 B1
(45) Date of Patent: May 6, 2014

(54) SUSPENDED CONTAINMENT WALL SYSTEM

(71) Applicants: Craig Eychaner, Bossier City, LA (US); Rob Rombough, Bossier City, LA (US); Steven Shugarts, Shreveport, LA (US); Daniel Smiley, Benton, LA (US); Joey Nuckols, Haughton, LA (US); Mike Davis, Shreveport, LA (US); Bill Nichols, Shreveport, LA (US)

(72) Inventors: Craig Eychaner, Bossier City, LA (US); Rob Rombough, Bossier City, LA (US); Steven Shugarts, Shreveport, LA (US); Daniel Smiley, Benton, LA (US); Joey Nuckols, Haughton, LA (US); Mike Davis, Shreveport, LA (US); Bill Nichols, Shreveport, LA (US)

(73) Assignee: Gordon Sales, Inc., Bossier City, LA (US)

( * ) Notice: Subject to any disclaimer, the term of this patent is extended or adjusted under 35 U.S.C. 154(b) by 0 days.

(21) Appl. No.: 13/835,526

(22) Filed: Mar. 15, 2013

(51) Int. Cl.
*E04B 2/08* (2006.01)
*E04B 2/00* (2006.01)

(52) U.S. Cl.
USPC ............... 52/241; 52/64; 52/238.1; 52/243.1; 52/474; 52/506.07

(58) Field of Classification Search
USPC .......... 52/126.3, 238.1, 239, 241, 243.1, 474, 52/506.07, 710, 29, 33, 64, 174
See application file for complete search history.

(56) References Cited

U.S. PATENT DOCUMENTS

| | | | |
|---|---|---|---|
| 3,067,323 A | | 12/1962 | Kember |
| 3,353,317 A | * | 11/1967 | Ensor ............................ 52/309.2 |
| 3,602,473 A | * | 8/1971 | Van Riet et al. ............... 248/317 |
| 3,619,960 A | * | 11/1971 | Thompson ........................ 52/241 |
| 3,683,100 A | * | 8/1972 | Deal et al. ...................... 174/491 |
| 3,759,001 A | * | 9/1973 | Judkins et al. ................... 52/241 |
| 4,081,931 A | | 4/1978 | Miyoshi |
| 4,570,391 A | | 2/1986 | Quante et al. |
| 4,679,368 A | * | 7/1987 | Pettinga et al. ................. 52/36.4 |
| 4,733,509 A | * | 3/1988 | Takahashi ..................... 52/126.5 |
| 4,953,333 A | * | 9/1990 | Carlson ............................ 52/281 |
| 5,010,702 A | * | 4/1991 | Daw et al. ........................ 52/241 |
| 5,050,362 A | * | 9/1991 | Tal et al. ....................... 52/588.1 |
| 5,063,636 A | * | 11/1991 | Dickson ............................ 16/98 |
| 5,146,648 A | * | 9/1992 | Hudson ........................... 16/94 R |
| 5,172,504 A | * | 12/1992 | De Maat et al. ................ 40/605 |
| 5,240,213 A | * | 8/1993 | Horcher ..................... 248/223.41 |
| 5,307,596 A | * | 5/1994 | Bockmiller ..................... 52/36.5 |

(Continued)

FOREIGN PATENT DOCUMENTS

EP 624696 A2 * 11/1994
WO WO 2010134071 A1 * 11/2010

OTHER PUBLICATIONS

Polargy, Inc., PolarPlex Suspended Panel System Specifications Sheet, Dec. 11, 2012 (1 page).*

(Continued)

*Primary Examiner* — Basil Katcheves
*Assistant Examiner* — Rodney Mintz
(74) *Attorney, Agent, or Firm* — Jones Walker LLP

(57) ABSTRACT

A suspended containment wall system including a support rail with a hook track positioned thereon and a hanging panel. The hanging panel further includes: (i) an attachment rail with a hook track oriented to engage the hook track of the support rail; and (ii) a panel body connected to the attachment rail.

9 Claims, 8 Drawing Sheets

(56) References Cited

U.S. PATENT DOCUMENTS

| | | | | |
|---|---|---|---|---|
| 5,371,981 | A * | 12/1994 | Bockmiller | 52/36.5 |
| 5,414,967 | A * | 5/1995 | Cates et al. | 52/281 |
| 5,603,192 | A * | 2/1997 | Dickson | 52/238.1 |
| 5,687,527 | A * | 11/1997 | Bikard et al. | 52/506.08 |
| 5,697,195 | A | 12/1997 | Maylon | |
| 5,794,397 | A * | 8/1998 | Ludwig | 52/506.08 |
| 5,809,730 | A * | 9/1998 | Renz | 52/506.09 |
| 5,916,100 | A * | 6/1999 | Mitchell et al. | 52/235 |
| 6,122,871 | A * | 9/2000 | Russell et al. | 52/243.1 |
| 6,336,247 | B1 * | 1/2002 | Schnoor | 16/87.6 R |
| 6,360,507 | B1 | 3/2002 | Nevers et al. | |
| 6,409,415 | B1 * | 6/2002 | Toder | 403/397 |
| 6,418,689 | B1 * | 7/2002 | Hacquard et al. | 52/474 |
| 6,634,149 | B2 * | 10/2003 | Cates et al. | 52/283 |
| 6,889,473 | B2 * | 5/2005 | Westra | 52/64 |
| 7,017,317 | B2 * | 3/2006 | Capozzo | 52/506.07 |
| 7,093,398 | B2 * | 8/2006 | Spransy et al. | 52/586.2 |
| 7,237,351 | B1 * | 7/2007 | Fehring | 40/611.01 |
| 7,260,919 | B1 * | 8/2007 | Spransy et al. | 52/586.1 |
| 7,272,913 | B2 * | 9/2007 | Mitchell | 52/235 |
| D568,060 | S * | 5/2008 | Munson | D6/396 |
| 7,513,086 | B2 * | 4/2009 | Helmus | 52/745.05 |
| 7,516,583 | B2 * | 4/2009 | Mitchell | 52/235 |
| 7,614,191 | B2 * | 11/2009 | Mitchell | 52/235 |
| 7,634,885 | B2 * | 12/2009 | Hoffmann | 52/585.1 |
| 7,685,786 | B2 * | 3/2010 | Cousin | 52/506.06 |
| 7,770,341 | B2 | 8/2010 | Fox | |
| 7,823,357 | B2 * | 11/2010 | Westra | 52/573.1 |
| 7,861,474 | B2 * | 1/2011 | Houle et al. | 52/242 |
| 8,033,071 | B2 * | 10/2011 | Miyata et al. | 52/481.2 |
| 8,037,644 | B2 * | 10/2011 | Hall | 52/69 |
| 8,127,508 | B2 * | 3/2012 | Muhlebach | 52/241 |
| 8,161,705 | B2 * | 4/2012 | Pratt | 52/506.05 |
| 8,166,728 | B1 * | 5/2012 | Nichols et al. | 52/783.19 |
| 8,327,591 | B2 * | 12/2012 | Wilkinson et al. | 52/243.1 |
| 8,402,700 | B2 * | 3/2013 | Hall et al. | 52/67 |
| 8,584,317 | B2 * | 11/2013 | Liebscher et al. | 16/91 |
| 8,627,611 | B2 * | 1/2014 | Cottuli et al. | 52/36.2 |
| 8,628,153 | B2 * | 1/2014 | Caveney et al. | 312/198 |
| 8,628,154 | B2 * | 1/2014 | Caveney et al. | 312/198 |
| 8,628,158 | B2 * | 1/2014 | Caveney | 312/265.3 |
| 2002/0026758 | A1 * | 3/2002 | Mitchell | 52/235 |
| 2003/0154672 | A1 * | 8/2003 | Spransy et al. | 52/238.1 |
| 2003/0213199 | A1 | 11/2003 | Bongio et al. | |
| 2006/0101744 | A1 * | 5/2006 | Falbaum et al. | 52/238.1 |
| 2006/0101745 | A1 * | 5/2006 | Kleege | 52/243.1 |
| 2006/0144001 | A1 * | 7/2006 | Capozzo | 52/506.01 |
| 2006/0272254 | A1 * | 12/2006 | Hoffmann | 52/474 |
| 2007/0000201 | A1 | 1/2007 | Kennedy et al. | |
| 2007/0056234 | A1 | 3/2007 | Wenstrup et al. | |
| 2007/0151938 | A1 * | 7/2007 | Burke | 211/59.3 |
| 2008/0155915 | A1 * | 7/2008 | Howe et al. | 52/220.3 |
| 2008/0302033 | A1 * | 12/2008 | Insalaco et al. | 52/220.2 |
| 2009/0049766 | A1 * | 2/2009 | Kopish | 52/167.1 |
| 2009/0127412 | A1 * | 5/2009 | Kleege | 248/214 |
| 2009/0173017 | A1 * | 7/2009 | Hall | 52/69 |
| 2010/0144265 | A1 * | 6/2010 | Bednarcik et al. | 454/184 |
| 2010/0154341 | A1 | 6/2010 | LaLonde | |
| 2010/0170181 | A1 * | 7/2010 | Nichols et al. | 52/483.1 |
| 2010/0205841 | A1 * | 8/2010 | Stancer, III | 40/607.14 |
| 2010/0257793 | A1 * | 10/2010 | George et al. | 52/64 |
| 2011/0203210 | A1 * | 8/2011 | Cousin | 52/506.06 |
| 2011/0232219 | A1 * | 9/2011 | Wilkinson et al. | 52/474 |
| 2011/0271610 | A1 * | 11/2011 | Cottuli et al. | 52/173.1 |
| 2011/0278998 | A1 * | 11/2011 | Caveney et al. | 312/109 |
| 2011/0278999 | A1 * | 11/2011 | Caveney et al. | 312/198 |
| 2012/0014060 | A1 * | 1/2012 | Slessman | 361/691 |
| 2012/0014061 | A1 * | 1/2012 | Slessman | 361/691 |
| 2012/0037353 | A1 * | 2/2012 | Coors | 165/279 |
| 2012/0100798 | A1 * | 4/2012 | Bermudez et al. | 454/338 |
| 2012/0181906 | A1 * | 7/2012 | Caveney | 312/237 |
| 2012/0240495 | A1 * | 9/2012 | Eychaner et al. | 52/220.6 |
| 2012/0281352 | A1 * | 11/2012 | Namek et al. | 361/679.46 |
| 2013/0047541 | A1 * | 2/2013 | Mayer | 52/506.05 |
| 2013/0086860 | A1 * | 4/2013 | Solomon et al. | 52/243.1 |
| 2013/0133350 | A1 * | 5/2013 | Reytblat | 62/259.2 |

OTHER PUBLICATIONS

Polargy, Inc., "PolarPlex SPS Suspended Panel System Product Information Sheet" brochure, Nov. 13, 2012, Sunnyvale, CA, 1 page.

* cited by examiner

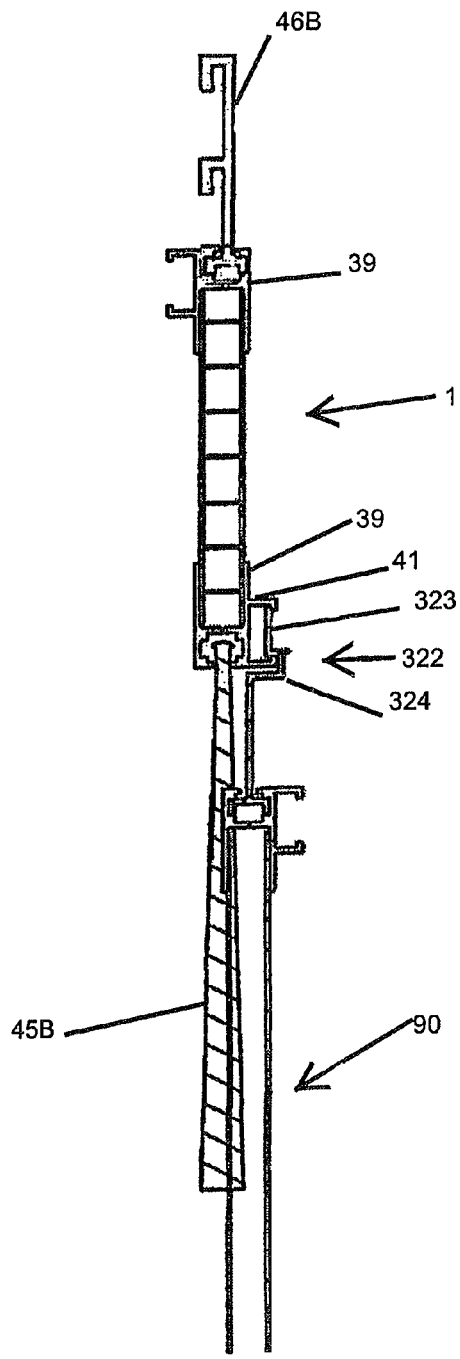
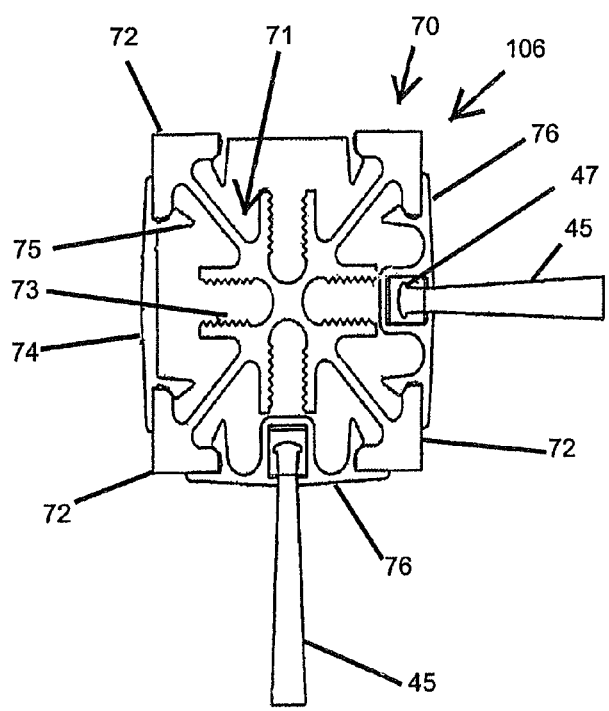
Figure 8
Figure 9

SUSPENDED CONTAINMENT WALL SYSTEM

Computer data centers house a large number of servers and various electronic equipment that must remain within a certain temperature range to function optimally. The servers are typically housed or organized in rows in "server cabinets" or on "server racks" and normally cool air is funneled through the front of the cabinets and exhausted as hot air from the rear of the cabinets. The failure to maintain separation of these air flows results in the mixture of hot and cold air, which creates problems for the effective operation of the data center. If the hot and cold air zones are not properly separated, the air conditioning system has to work excessively in order to compensate for the temperature loss due to the air mixing, leading to loss of efficiency and higher operating costs. Additionally, the equipment will function inconsistently and the operational life span will be shortened if the air supplied to it does not remain within a reasonably controlled temperature range. Data centers utilize various containment solutions to minimize the mixing of these two different temperature air streams. As one example, a corridor is formed along the face of the server cabinets separating the cool air stream from the hot air stream, which is exhausted out of the rear of the server cabinets and allowed to exit the space through an open ceiling above.

BRIEF DESCRIPTION OF THE DRAWING

FIG. 8 illustrates how the embodiment of FIG. 6 integrates with other panel suspension structures.

FIG. 9 illustrates a vertical frame member utilized in one embodiment of the containment system.

DETAILED DESCRIPTION OF SELECTED EMBODIMENTS

Figure 1A:
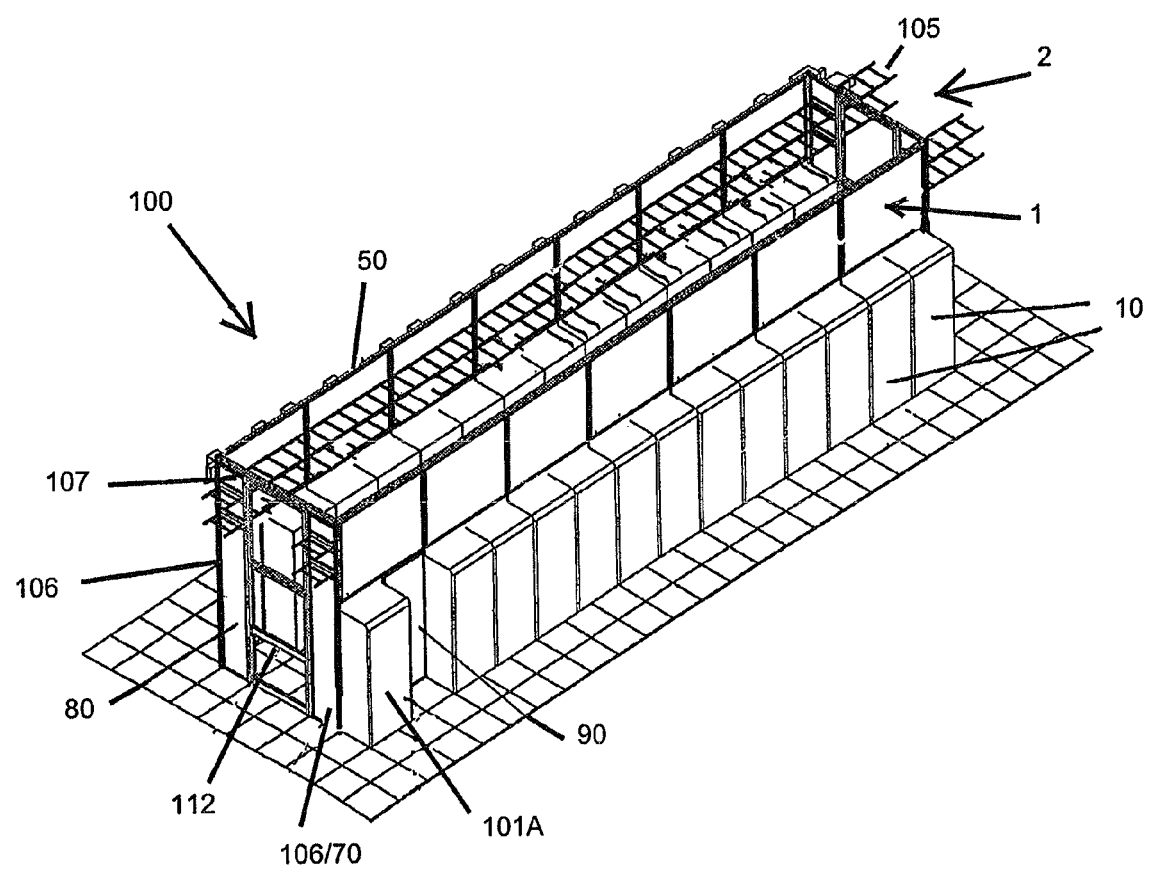
FIG. 1A illustrates a data center employing one embodiment of the suspended wall containment system.
Figure 1B:
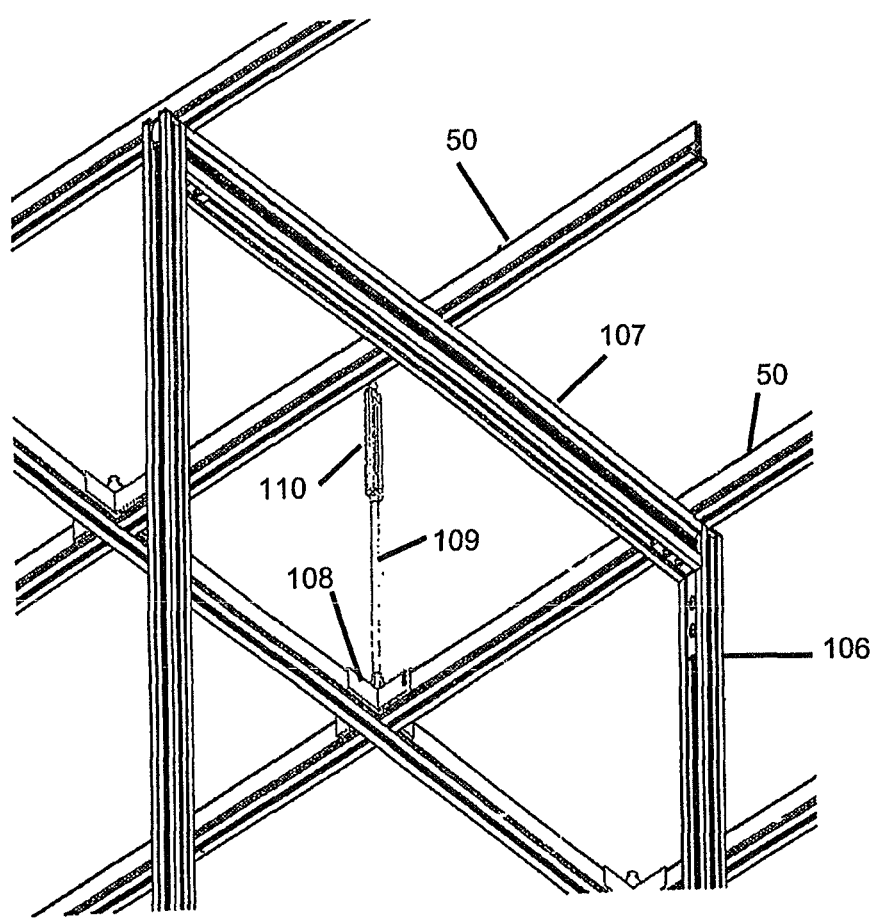
FIG. 1B illustrates one example of certain frame and overhead support components which may be used with the suspended wall containment system.

FIG. 1A suggests the typical arrangement of a data center 100 having two rows of server cabinets 101 and a containment center frame 2 formed around the server cabinets. In the embodiment of FIG. 1A, the containment center frame is constructed from a series of vertical frame members 106, horizontal frame members 107, and suspension rails 50 (described in greater detail below), all of which may be connected together in any conventional manner. FIG. 1B illustrates how support rods 109 connect to bracket 108 which engages suspension rails 50. Support rod 109 is shown engaging turn-buckle 110, which ultimately is suspended from the existing ceiling or joist system (not shown) of the building housing the data center. Obviously, FIG. 1B illustrates merely one example the overhead structure which could support the panel system of the present invention and any number of alternative support systems/methods could be employed.

Figures 2, 3:
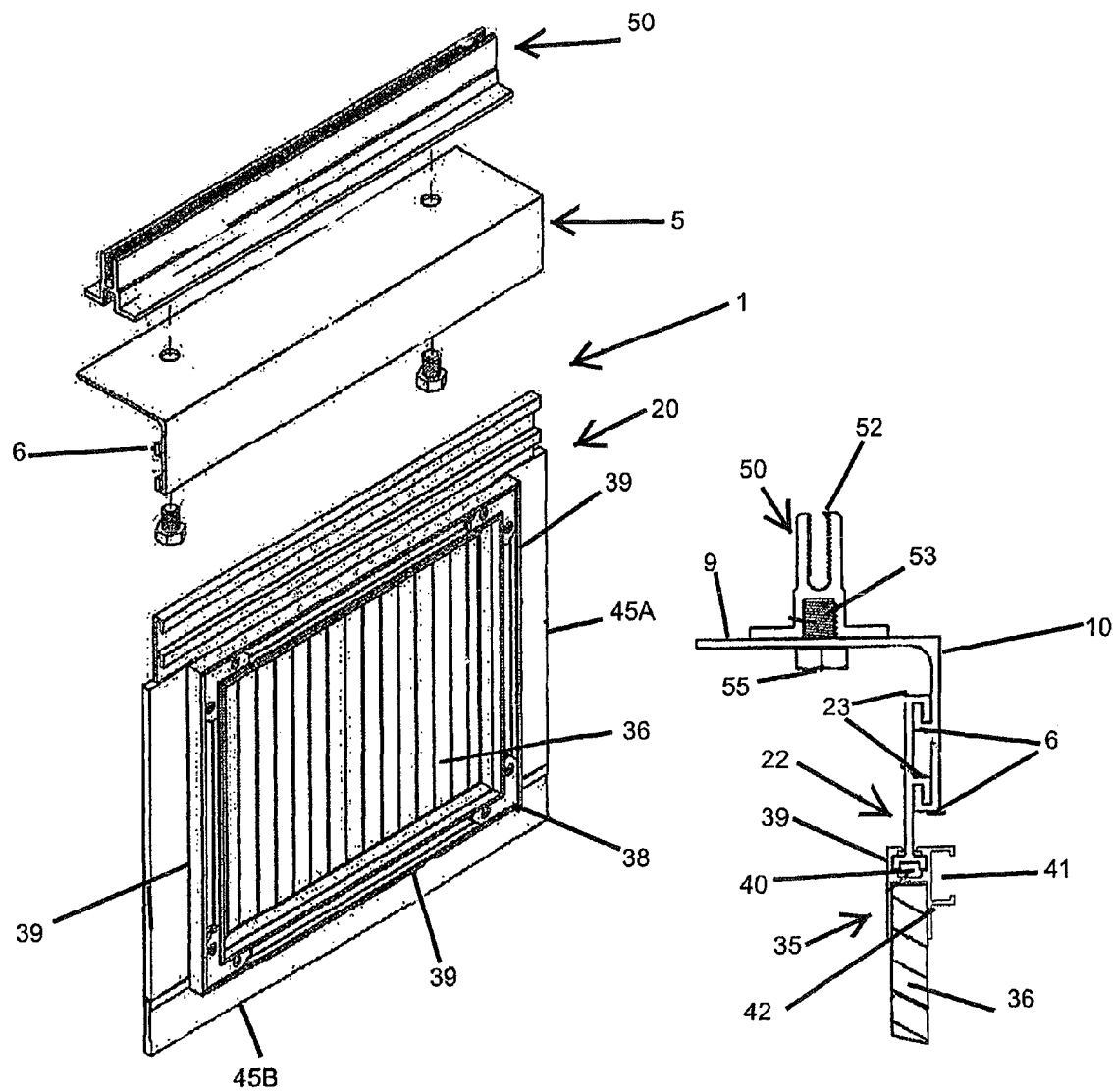
FIG. 2 illustrates one embodiment of the suspended wall containment system.
FIG. 3 illustrates a cross-section view of one embodiment of the panel suspension structure.
Figure 4A:
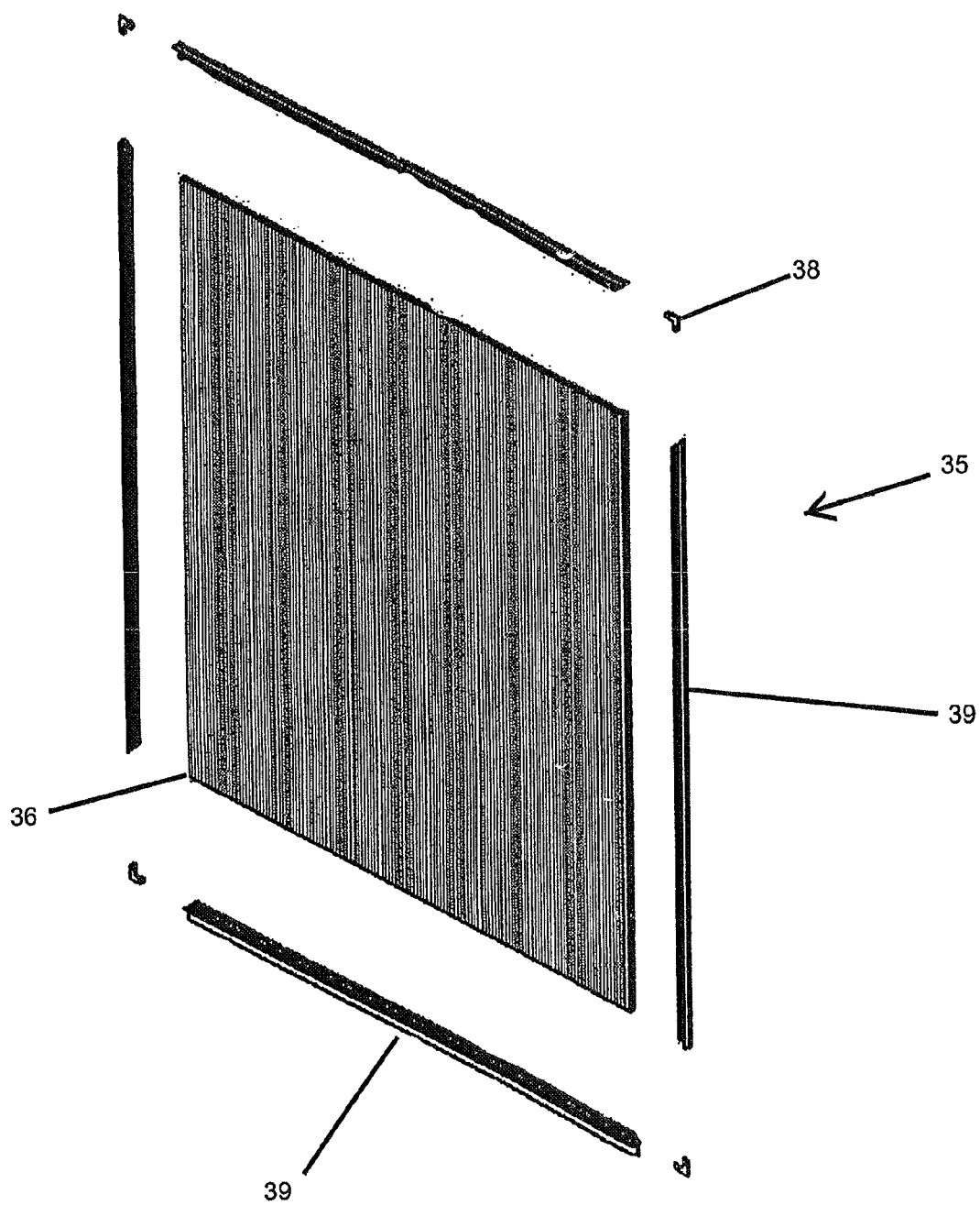
FIG. 4A illustrates an exploded view of one embodiment of a wall panel.

FIG. 1A also illustrates conventional wire rack/hangers 105 typically used in data centers to run the various power, data, networking, and other cables required for operation of the data center. One embodiment of the present suspended wall or panel system is generally shown by reference number 1 in FIG. 1A. FIGS. 2, 3, and 4A illustrate this embodiment of suspended panel system 1 in greater detail. In FIG. 2, the general components associated with this panel system embodiment include a suspension rail 50, a support rail 5, and a hanging panel 20. FIGS. 2 to 4A more clearly illustrate certain details of these structures. As suggested in FIGS. 2 and 4A, this embodiment of hanging panel 20 includes a panel body 35 formed of frame members 39 and a sheet of polymer material 36. As used herein, the term "sheet" refers to any generally planar section of material, which may be a single layer or multiple layers of material, including multiple layers with cells or air gaps between the layers. In one preferred embodiment, the polymer material is a twin-wall, hollow profile 10 mm (0.39 inches) sheet formed of polycarbonate, one example of which is sold under the tradename Polygal PCSS by Polygal Plastics Industries Ltd. of Ramat Hashofet, Israel. However, many alternative material thicknesses and types could be utilized, whether based upon polymers, metals, wood fibers, or other materials. Typically the materials have some degree transparency or translucency to allow light transfer, but other embodiments may utilize an opaque material. In many embodiments, the hanging panel 20 may range between about 0.91 meters (3 feet) and about 3.66 meters (12 feet) in width (or any sub-range in between). However, other embodiment could have a width less than 0.91 meters (3 feet) and greater than 3.66 meters (12 feet).

Figure 5A:
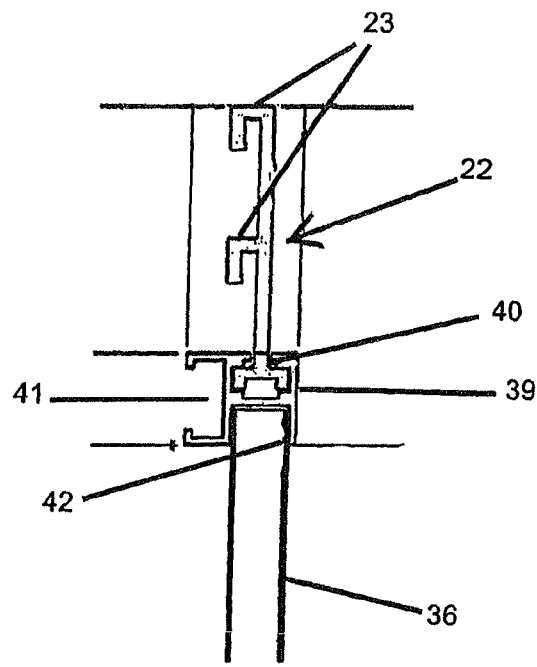
FIG. 5A illustrates a cross-section view of one embodiment of a panel top frame member.

As seen in FIGS. 3 and 5A, the illustrated frame member 39 includes a first, smaller c-shaped channel (or "C-channel") 40, a second, larger C-channel 41, and a sheet retaining channel 42. C-channel 40 connects with attachment rail 22, which includes at least one hook shaped structure 23. It will be understood that the hook shaped structure runs along at least part of the length of attachment rail 22 and may be referred to as a hook channel or a hook track 23. In FIGS. 2 and 3, the hook track 23 is a double hook track in that it has two hook structures. However, other embodiments could have a single hook structure or more than two hook structures. As suggested by FIGS. 2, 4A, and 5A, the sheet 36 of polymer material is surrounded by four frame members 39 with sheet 36 resting in the sheet retaining channels 42. The four frame members 39 will be connected to one another by chevron-shaped retainer 38 being positioned in the larger C-channel 41 at the points where frame members 39 meet. Chevron-shaped retainer 38 may be secured to the frame members 39 by screws or other attachment mechanisms. Naturally, the use of chevron-shaped retainers 38 is merely one example of connecting the frame members 39 and any other suitable conventional or future developed connecting means could be employed in the alternative. Likewise, alternate embodiments of the hanging panels may have no side or bottom frame members and the panel sheet could connect to the to an attachment rail either indirectly (via a upper frame member) or directly (i.e., with no intervening frame member). All such variations are intended to come within the scope of the present invention.

Figure 5B:
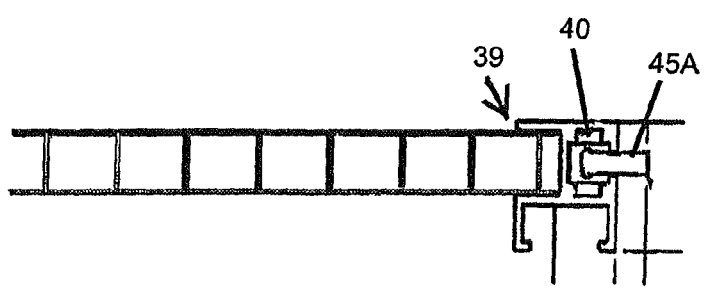
FIG. 5B illustrates a cross-section view of one embodiment of a panel side frame member.
Figure 5C:
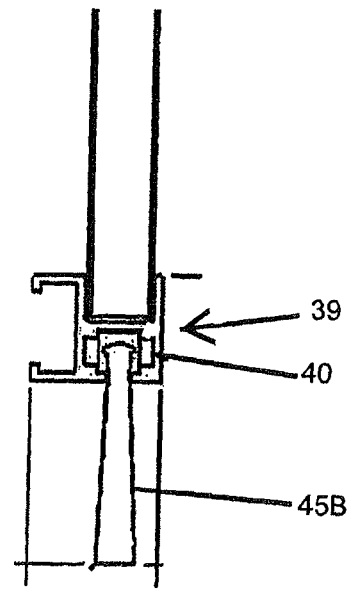
FIG. 5C illustrates a cross-section view of one embodiment of a panel bottom frame member.

Another component of panel body 35 is the flexible edge material positioned on frame members 39. In the illustrated embodiments, the edge material is formed of brushes 45 which are secured to bottom and side frame members 39 by engaging the smaller C-channels 40 as suggested in FIGS. 5B and 5C. Brushes 45 will engage structures adjacent to the panel bodies in order to inhibit air flow through this engagement area. For example, the bottom brushes 45B in FIG. 2 may rest against the top of server cabinets while the side brushes 45A may rest against similar brushes on adjacent panel bodies and vertical framing members. In one preferred embodiment, the brushes are formed of polyamide (Nylon 6) fibers such as those sold under the trademark Ultramid® B3 by BASF Corporation of Florham Park, N.J. Although brushes are illustrated in the figures, other edge materials could be employed along the frame members, nonlimiting examples of which include gaskets, rubber strips, foam materials, gel filled structures, or magnetic strips.

Again, viewing FIG. 3, this embodiment of support rail 5 is shown as an angled support rail having horizontal flange 9 and vertical flange 10. It can be seen how fastener 55 (here a conventional bolt) may extend through horizontal flange 9 in order to engage the threaded channel 53 in suspension rail 50 and thereby have suspension rail 50 support the suspended wall system. Although not shown in the figures, it will be understood that a threaded rod may extend from the ceiling or other overhead support structure in order to engage the upper threaded channel 52 on suspensionrail 50. While the suspension rail 50 may take on many different cross-sectional shapes, in this embodiment suspension rail 50 takes on an inverted T-shape and may sometimes be referred to as suspension "tee" 50. FIG. 3 also shows how one or more hook tracks or channels 6 will be formed along the vertical flange 10 and engage similarly shaped hook tracks 23 on attachment rail 22. Although the alternative of a single hook track formed on support rail 5 and attachment rail 22 is included in the present invention, in many situations a pair of hook tracks such as seen in the figures will provide extra stability for the hanging wall panel 20. Similarly, the illustrated suspension rail 50 is simply one manner of suspending the support rail and any number of clips or other connecting mechanisms or means could be used to secure the support rail to either the existing conventional ceiling structure (e.g., a T-bar ceiling grid) or a specialty overhead suspension structure.

In the illustrated embodiments, frame members 39, support rails 5, attachment rails 22, and suspension tees 50 are all formed of extruded aluminum. However, alternate embodiments of these components could likewise be made of various aluminum alloys, other metals, high-strength plastics, or still further materials.

Figures 6, 7:
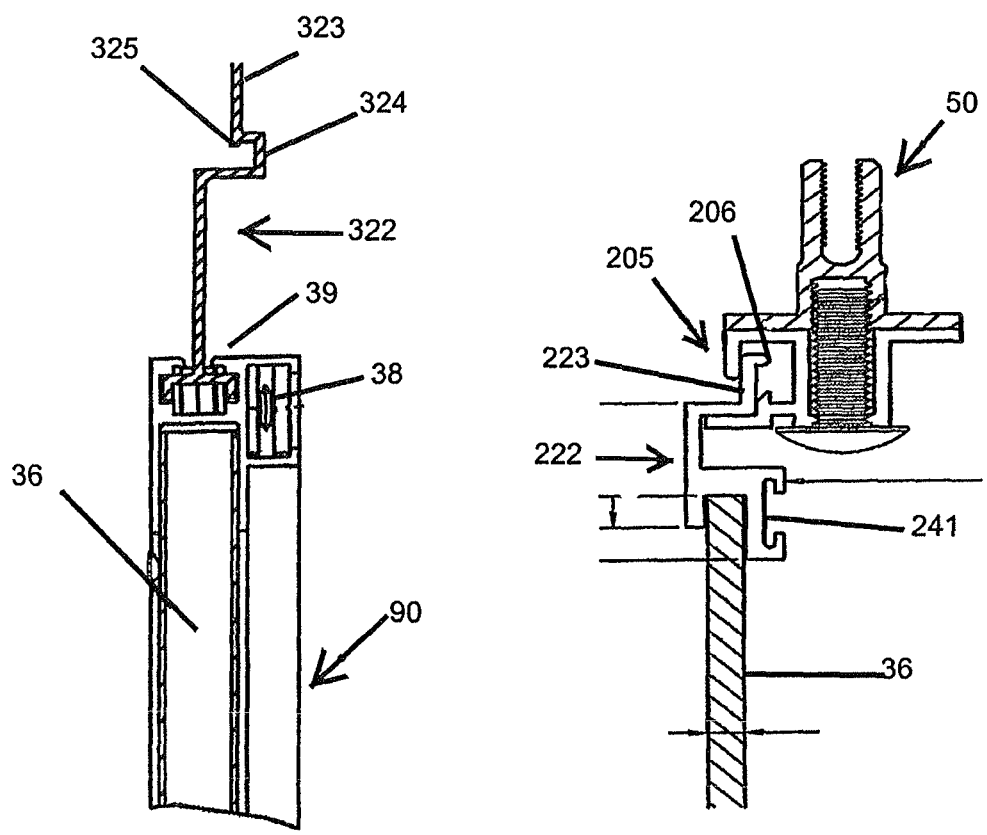
FIG. 6 illustrates a cross-section view of an alternate embodiment of a panel suspension structure.
FIG. 7 illustrates a cross-section view of a further alternate embodiment of a panel suspension structure.

FIG. 7 illustrates an alternative support rail 205 and attachment rail 222. The hook track 206 takes a somewhat different shape than seen in FIG. 3, but should nevertheless be considered another variation of a single hook track which engages an opposing single hook track 223 formed in attachment rail 222. The suspension rail 50 illustrated in FIG. 7 functions as described in previous embodiments. The C-channel 241 could be engaged by a chevron-shaped retainer when the panel sheet 36 is enclosed by frame members as described in FIG. 4A. However, in embodiments where chevron-shaped retainers are not used (e.g., the panel sheet 36 does not have surrounding frame members, but only a top frame member or direct connection to the attachment rail), then C-channel 241 may serve as a "splice channel." In such embodiments, a "splice plate" shaped to engage C-channel 241 is inserted through the C-channels 241 on adjacent panels in order to assist in maintaining the panels in their position relative to one another. FIG. 7 also suggests how the support rail/attachment rail interface need not take on any particular configuration and any number of interlocking cross-sectional shapes may perform the support rail and attachment rail functions.

Figures 4B, 4C:
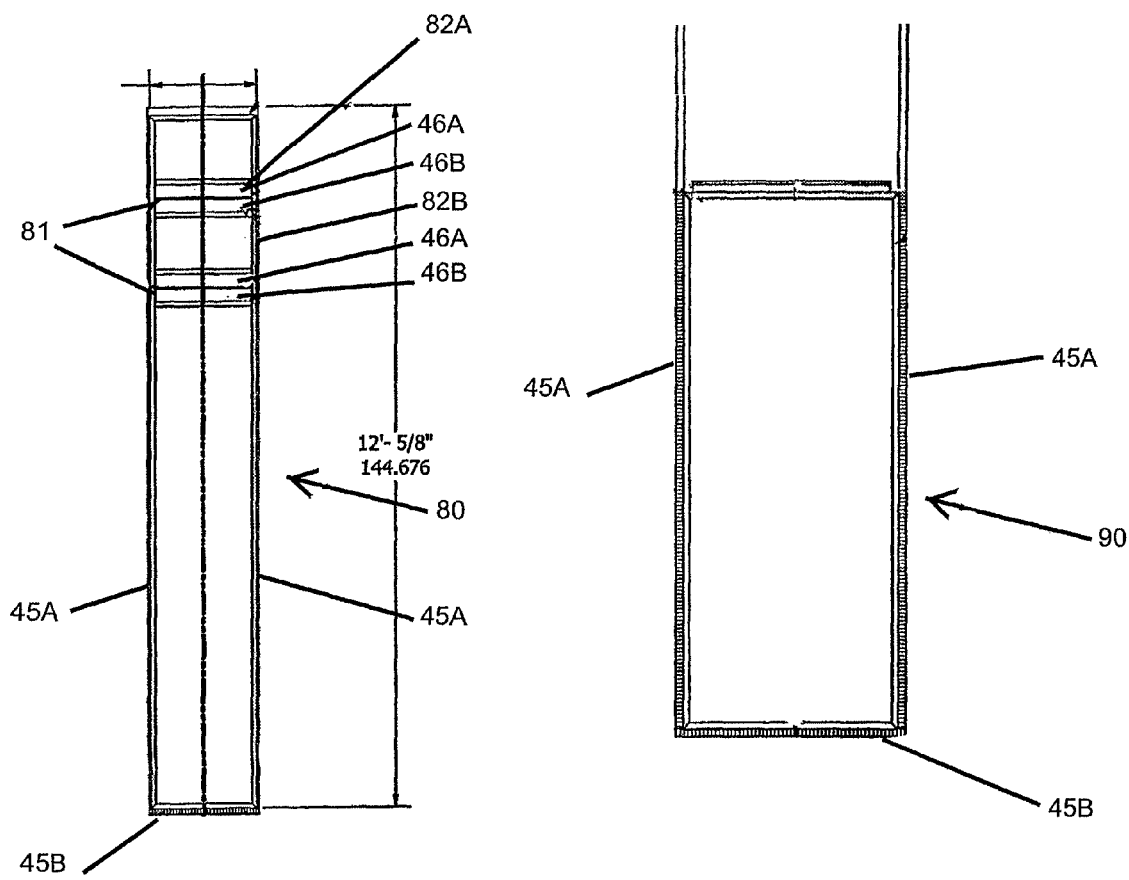
FIG. 4B illustrates one modification of the wall panel of FIG. 4A.
FIG. 4C illustrates a second modification of the wall panel of FIG. 4A.

Different panel embodiments may use somewhat different connections systems. For example, FIG. 1A shows a temporary filler panel 90 intended to cover the area where a server cabinet 101 has not been installed or has been temporarily removed. A front view of such filler panel 90 is seen in FIG. 4C while the connection system for such a panel is illustrated in FIGS. 6 and 8. FIG. 6 shows the filler panel 90 has a differently shaped attachment rail 322. This embodiment of attachment rail 322 includes a vertical upper leg 323 with horizontal elbow section 324 positioned below leg 323. FIG. 8 suggests how attachment rail 322 will engage a C-channel 41 of the panel 1 positioned above filler panel 90. The upper vertical leg 323 of the attachment rail engages the upper portion of C-channel 41 while the lower portion of C-channel 41 engages horizontal elbow section 324. A tab portion 325 (FIG. 6) at the junction of vertical upper leg 323 with horizontal elbow section 324 further engages the lip at the lower portion of C-channel 41 in order to maintain the attachment rail 322 more securely within C-channel 41. FIG. 8 also illustrates how the somewhat extended brush 45B hangs from this embodiment of panel 1 to cover the upper portion of filler panel 90.

It will be understood that the hanging panels can take on many shapes and sizes. In addition to the above cabinet panels 1 and filler panels 90, FIG. 1A also illustrates a door frame panel 80 which hangs on either side of door 112 and whose height is substantially greater than it's width. Like previous panels, door frame panel 80 includes side brushes 45A and bottom brushes 45B. However, as suggested in FIG. 4B, door frame panels 80 may further include two pairs of opposing brushes 46A and 46B which act to cover rectangular openings 81. The brushes 46A and 46B are attached to opening edges 82A and 82B, respectively, such that the free ends of the brushes meet at the center of openings 81. Viewing FIG. 1A, it can be visualized how cable racks 105 may extend through openings 81 (and brushes 46) while allowing the brushes 46 to fill any area of openings 81 not actually occupied by cable racks 105, thereby minimizing the air loss through openings 81.

A further embodiment of the present invention includes a novel vertical frame member 106 for a containment center frame 2 such as seen in FIGS. 1A and 1B. In certain embodiments, the vertical frame member 106 may have a cross-sectional structure 70 such as seen in FIG. 9. This embodiment of the vertical frame member includes the central rail 71 with a series of corner extensions 72 radiating from central rail 71. In FIG. 9, there are four corner extensions 72, but other embodiments could have fewer (e.g., three) or more (e.g., five) corner extensions 72. In the embodiment of FIG. 9, central rail 71 and corner extensions 72 are part of an integrally formed extruded metal rail, but other embodiments could be formed of non-metal materials and need not be integrally formed. The embodiment of FIG. 9 also includes one or more (e.g. four) threaded channels 73 formed in central rail 71 in order to facilitate attachment to other structural members via bolts and similar threaded fasteners. This embodiment further has one or more face panels 74 which will cover the gaps between adjacent corner extensions 72 in areas where no fastener engages the treaded channels 73. In the illustrated example, the face panels 74 will be formed of a plastic material and will include clip members 75 which snap into place and engage one or more edges on the corner extensions 72. One particular variation of the face panels are face panels 76 which incorporate a brush member 45. The brush members 45 may be similar to those described above and in the FIG. 9 embodiment, have a base 47 which is integrally formed in the plastic material of face panel 76. In the illustrated embodiment, brush base 47 and face panel 76 may both be of plastic, but they may or may not be of the same type of plastic. One example use for the embodiment of FIG. 9 is suggested by the vertical frame member 106/70 seen in FIG. 1A abutting server cabinet 101A. It can be envisioned how the two right-angle oriented brush members 45 in FIG. 9 would be positioned to engage the corner of the cabinet 101A against which the vertical frame member is positioned, thereby allowing the brush members to block the flow of air through any potential gap between the vertical frame member 106 and the server cabinet 101A.

Although the illustrated embodiments show rectangular panels, it will be understood the panels could take on other geometrical shapes where special circumstances dictate. While the above description recites several specific embodiments of the present invention, those skilled in the art will recognize many obvious modifications and variations. All such modifications and variations are intended to fall within the scope of the following claims.

The invention claimed is:
1. A suspended containment wall system comprising:
 a. a support rail including a substantially horizontal flange and a substantially vertical flange, the vertical flange further including a double hook channel positioned thereon;
 b. a hanging panel including:
  (i) an attachment rail with a double hook track oriented to engage the double hook channel of the support rail; and
  (ii) a panel body connected to the attachment rail;
 c. a suspension rail positioned above the support rail, the suspension rail having a first threaded slot for connection to the support rail and a second threaded slot for connection to a ceiling structure;
 d. a threaded member extending from the substantially horizontal flange of the support rail and engaging the first threaded slot on the suspension rail to connect the support rail to the suspension rail.

2. The wall system according to claim 1, wherein the hooks of the double hook channel are oriented vertically with respect to one another, and wherein the hooks of the double hook track are oriented vertically with respect to one another.

3. The wall system according to claim 1, wherein the double hook channel on the support rail has an upward orientation.

4. The wall system according to claim 1, wherein the support rail and attachment rail are formed from an extruded metal.

5. The wall system according to claim 1, wherein the panel body has multiple sides and a brush material is formed along a majority of at least one of the sides.

6. The wall system according to claim 1, wherein the panel body is formed of an at least translucent polymer material.

7. The wall system according to claim 6, wherein the panel body comprises a polycarbonate sheet.

8. The wall system according to claim 1, wherein the panel body includes a metal frame surrounding a polymer material.

9. The wall system according to claim 8, wherein the attachment rail is connected to at least one member of the metal frame.

* * * * *